United States Patent
Wu et al.

(10) Patent No.: US 7,384,836 B2
(45) Date of Patent: Jun. 10, 2008

(54) INTEGRATED CIRCUIT TRANSISTOR INSULATING REGION FABRICATION METHOD

(75) Inventors: You-Kuo Wu, Taipei County (TW); Edward Chiang, Hsin Chu (TW); Shun-Liang Hsu, Hsin Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/505,957

(22) Filed: Aug. 17, 2006

(65) Prior Publication Data

US 2006/0286735 A1 Dec. 21, 2006

Related U.S. Application Data

(62) Division of application No. 10/916,133, filed on Aug. 11, 2004, now Pat. No. 7,122,876.

(51) Int. Cl.
*H01L 21/8234* (2006.01)

(52) U.S. Cl. ............ 438/197; 438/198; 438/199; 438/200; 438/201; 438/202; 438/294; 438/295; 438/296; 438/297; 257/E21.545

(58) Field of Classification Search ........ 438/197, 438/198, 199, 200, 201, 202, 203, 294, 295, 438/296, 297; 257/E21.545
See application file for complete search history.

(56) References Cited

U.S. PATENT DOCUMENTS

| | | | |
|---|---|---|---|
| 4,878,096 A | 10/1989 | Shirai et al. | |
| 5,529,948 A * | 6/1996 | Lur et al. | 438/450 |
| 5,679,602 A * | 10/1997 | Lin et al. | 438/298 |
| 5,801,080 A * | 9/1998 | Inoue et al. | 438/405 |
| 6,025,628 A | 2/2000 | Lee et al. | |
| 6,093,588 A * | 7/2000 | De Petro et al. | 438/180 |
| 6,265,241 B1 * | 7/2001 | Pan | 438/57 |
| 6,376,296 B2 | 4/2002 | Tung | |
| 6,492,703 B1 * | 12/2002 | Pan | 257/461 |
| 6,528,850 B1 * | 3/2003 | Hebert | 257/345 |
| 2002/0037620 A1 * | 3/2002 | Park et al. | 438/294 |
| 2004/0033666 A1 | 2/2004 | Williams et al. | |
| 2004/0222488 A1 * | 11/2004 | Abadeer et al. | 257/510 |
| 2005/0064670 A1 | 3/2005 | Pan et al. | |
| 2006/0189081 A1 * | 8/2006 | Hsu et al. | 438/268 |
| 2006/0270171 A1 * | 11/2006 | Chen et al. | 438/297 |
| 2007/0108517 A1 * | 5/2007 | Wu et al. | 257/335 |
| 2007/0128810 A1 * | 6/2007 | Kao | 438/286 |
| 2007/0158741 A1 * | 7/2007 | Hsu et al. | 257/335 |
| 2007/0202952 A1 * | 8/2007 | Francis et al. | 463/42 |

* cited by examiner

*Primary Examiner*—Hsien-Ming Lee
*Assistant Examiner*—Ankush k Singal
(74) *Attorney, Agent, or Firm*—Slater & Matsil, L.L.P.

(57) ABSTRACT

A transistor of an integrated circuit is provided. A first doped well region is formed in a well layer at a first active region. At least part of the first doped well region is adjacent to a gate electrode of the transistor. A recess is formed in the first doped well region, and the recess preferably has a depth of at least about 500 angstroms. A first isolation portion is formed on an upper surface of the well layer at least partially over an isolation region. A second isolation portion is formed at least partially in the recess of the first doped well region. At least part of the second isolation portion is lower than the first isolation portion. A drain doped region is formed in the recess of the first doped well region. The second isolation portion is located between the gate electrode and the drain doped region.

17 Claims, 17 Drawing Sheets

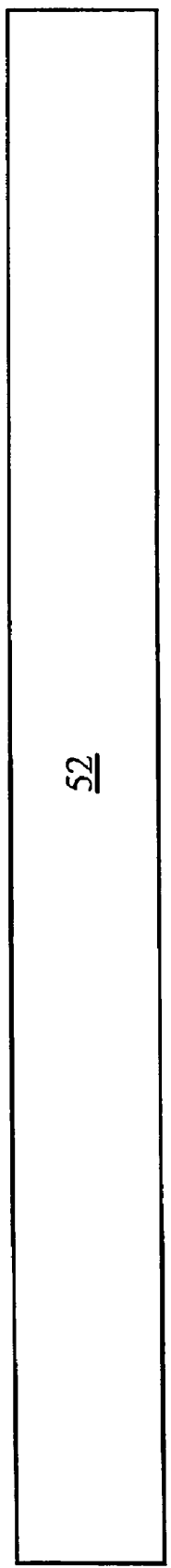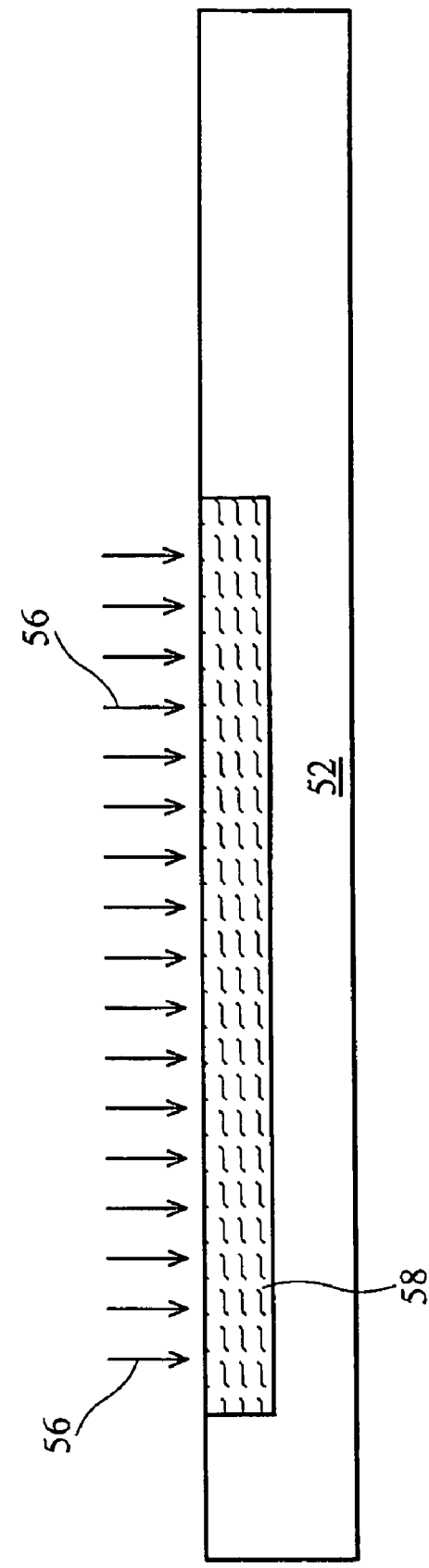

INTEGRATED CIRCUIT TRANSISTOR INSULATING REGION FABRICATION METHOD

This application is a divisional of patent application Ser. No. 10/916,133, (TSM03-1128), entitled "Transistor," filed Aug. 11, 2004 now U.S. Pat. No. 7,122,876, which application is incorporated herein by reference.

TECHNICAL FIELD

The present invention relates to semiconductor devices. In one aspect it relates more particularly to LDMOS transistor devices.

BACKGROUND

FIG. 1 is a cross-section view of a lateral double-diffused MOSFET (LDMOS) transistor 20 of the prior art. Such LDMOS devices are often used as a high voltage transistor for power MOS applications, for example. Such LDMOS devices are typically formed on a same substrate as low voltage transistors in an integrated circuit.

Referring to the example LDMOS transistor 20 of FIG. 1, a p-type well layer 22 is formed on a substrate 24. An isolation region 26, which includes isolation field oxide 28, defines an active area 30 for the LDMOS transistor 20 shown in FIG. 1. The well layer 22 has a high voltage n-type well region 32 and a high voltage p-type well region 33 formed therein. A well field oxide 34 is formed (e.g., by thermal growth) over the n-type well region 32. The well field oxide 34 of the prior art is usually formed during the same process and at the same level as the isolation field oxide 28. A drain N+ doped region 36 is formed in the n-type well region 32 between the well field oxide 34 and the isolation field oxide 28. A source N+ doped region 38 is formed in the p-type well region 33 and between a gate dielectric 40 and the isolation field oxide 28. Also, a source P+ doped region 42 is formed in the p-type well region 33 between the source N+ doped region 38 and the isolation field oxide 28.

One of the purposes of the well field oxide 34 is to reduce hot carrier effects and increase the on-breakdown voltage level for the LDMOS power device 20. A higher electron field between the drain 36 and gate electrode 44 may cause hot carriers to form between the drain 36 and the gate electrode 44, which may penetrate the gate dielectric 40 and the well field oxide 34. Such hot carrier effects may cause decreased reliability, reduced gate oxide integrity (GOI), and a non-ideal IV operation curve at high voltage levels. For example, an IV operation curve for the LDMOS device 20 of FIG. 1 is shown in FIG. 2. Region 46 in FIG. 2 shows that the IV operation curve becomes non-ideal as the voltage from drain to source ($V_{ds}$) becomes higher (e.g., above about 60 V). The vertical axis of FIG. 2 is the current from drain to source ($I_{ds}$) in the LDMOS device 20 of FIG. 1. In 100 V LDMOS technology of the prior art, for example, the curves of lower voltage from gate to source ($V_{gs}$) (e.g., at about 10-30 V) have abnormal trends when the $V_{ds}$ is higher, in such cases. Hence, a need exists for a LDMOS device that has a more ideal IV operation curve at higher voltage levels for $V_{ds}$ (e.g., above about 60 V) to provide more reliable operation of the LDMOS device at such levels.

SUMMARY OF THE INVENTION

The problems and needs outlined above may be addressed by embodiments of the present invention. In accordance with one aspect of the present invention, a transistor of an integrated circuit is provided, which includes: a gate electrode, a first doped well region, a recess, a first isolation portion, a second isolation portion, and a drain doped region. The first doped well region is formed in the well layer at the first active region. At least part of the first doped well region is adjacent to the gate electrode of the transistor. The recess is formed in the first doped well region. The first isolation portion is formed on the upper surface of the well layer at least partially over the isolation region. The second isolation portion is formed at least partially in the recess of the first doped well region, such that at least part of the second isolation portion is lower than the first isolation portion. The drain doped region is formed in the recess of the first doped well region adjacent to the second isolation portion, such that the second isolation portion is located between the gate electrode and the drain doped region.

In accordance with another aspect of the present invention, a method of fabricating a transistor is provided. This method includes the following steps described in this paragraph. The order of the steps may vary, may be sequential, may be simultaneous, may overlap, may be in parallel, and combinations thereof. A first doped well region is formed in a first active region of a well layer. A temporary field oxide is formed on the first doped well region. The temporary field oxide is removed to form a recess in the first doped well region. A permanent field oxide is formed. At least part of the permanent field oxide is formed in the recess. A drain doped region is formed in the recess and in the first doped well region adjacent to the part of the permanent field oxide formed in the recess. A gate electrode is formed over the first active region such that at least part of the gate electrode is adjacent to the recess. The part of the permanent field oxide formed in the recess is located between the gate electrode and the drain doped region.

In accordance with yet another aspect of the present invention, a method of fabricating a transistor is provided. This method includes the following steps described in this paragraph. The order of the steps may vary, may be sequential, may be simultaneous, may overlap, may be in parallel, and combinations thereof. A first doped well region is formed in a first active region of a well layer with a first plurality of ions. A temporary field oxide is formed on the first doped well region. The temporary field oxide is removed to form a recess in the first doped well region, wherein the recess has a depth of at least about 500 angstroms. A permanent field oxide is formed. At least part of the permanent field oxide is formed in the recess. A drain doped region is formed in the recess and in the first doped well region adjacent to the part of the permanent field oxide formed in the recess. A gate electrode is formed over the first active region such that at least part of the gate electrode is adjacent to the recess, wherein the part of the permanent field oxide formed in the recess is located between the gate electrode and the drain doped region.

In accordance with yet another aspect of the present invention, a transistor of an integrated circuit is provided, which includes: a well layer, an isolation region, a first doped well region, a gate electrode, a recess, a first field oxide, a second field oxide, and a drain doped region. The well layer is formed on a substrate. The well layer has an upper surface. The isolation region is formed in the well layer to at least partially bound and define a first active region in the well layer. The first doped well region is formed in the well layer at the first active region. At least part of the first doped well region is adjacent to the gate electrode of the transistor. The recess is formed in the first doped well region. The first field oxide is formed on the upper surface of the well layer at least partially over the isolation region. The second field oxide is formed at least partially in the recess of the first doped well region, such that at least part of the second field oxide is lower than the first field oxide. The drain doped region is formed in the recess of the first doped well region adjacent to the second field oxide, such that the second field oxide is located between the gate electrode and the drain doped region.

The foregoing has outlined rather broadly features of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which:

FIGS. 3-17 show illustrative processing steps for forming the LDMOS transistor structure shown in FIG. 17.

DETAILED DESCRIPTION OF ILLUSTRATIVE EMBODIMENTS

Figure 1:
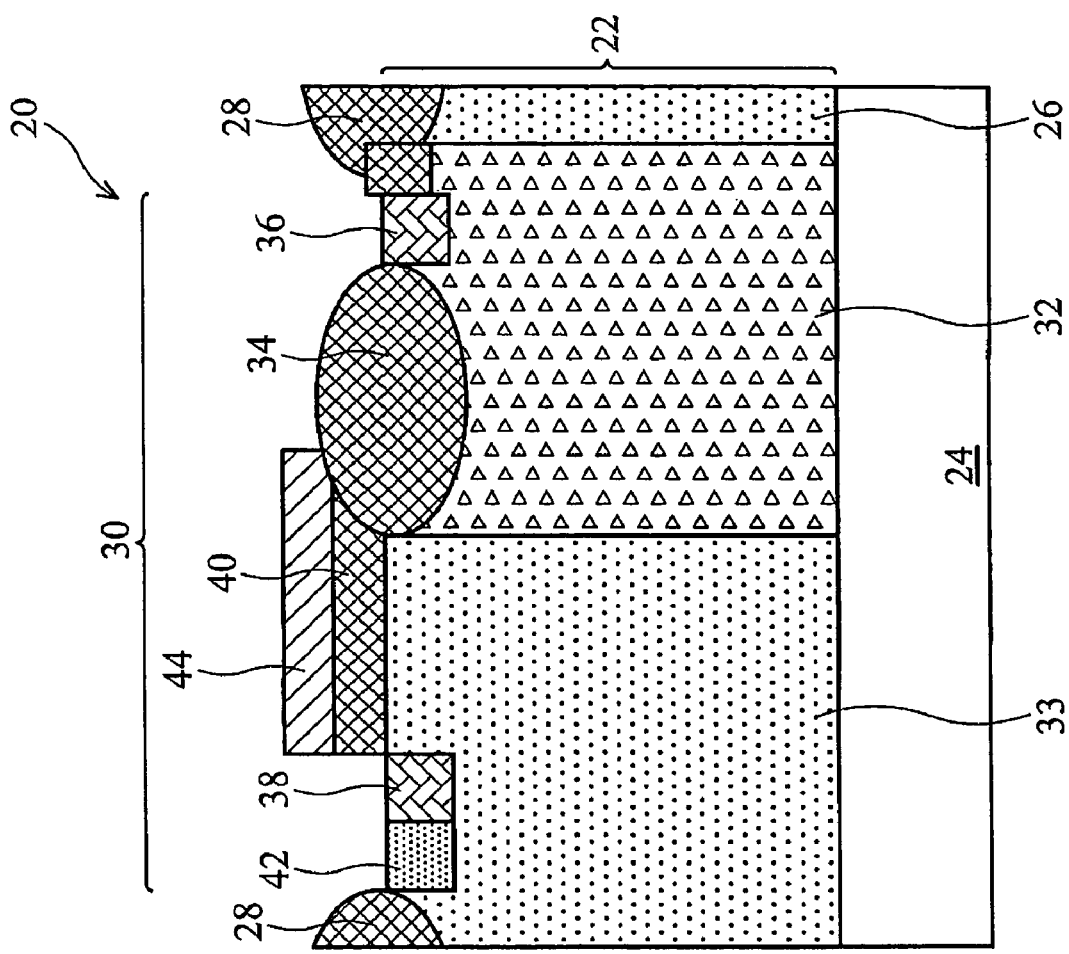
FIG. 1 is a cross-section view of a high voltage LDMOS transistor of the prior art.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

FIGS. 3-17 show some illustrative steps in forming a first embodiment of the present invention. In the first embodiment, a high voltage LDMOS transistor 50 is formed on a same substrate 52 adjacent to a low voltage transistor 54 (see e.g., FIG. 17). It is often preferred or desired to form a high voltage transistor on a same substrate adjacent to a low voltage transistor. In other embodiments, however, a transistor embodiment of the present invention may be formed adjacent to other types of devices.

Beginning in FIG. 3, a substrate 52 is provided. In the first embodiment, the substrate 52 is silicon. The substrate 52 may be made from any of a variety of suitable materials, including (but not limited to): silicon-on-insulator structure, silicon, silicon germanium, composites thereof, various crystal orientations thereof, and combinations thereof, for example. In the first embodiment, the silicon substrate 52 has p-type doping and a <100> crystal orientation, for example. As shown in FIG. 4, the substrate 52 may be doped with a first plurality of ions 56 to form a buried doped layer 58. Note that the patterned mask for this step is not shown in FIG. 4. In the first embodiment, the buried doped layer 58 is n-type, for example. Following the implanting of the first plurality of ions 56, a well drive in step is preferably performed (e.g., thermal drive in step). In other embodiments (not shown), the buried doped layer 58 may be omitted or substituted with a trench filled with insulating material, for example.

Figure 5:
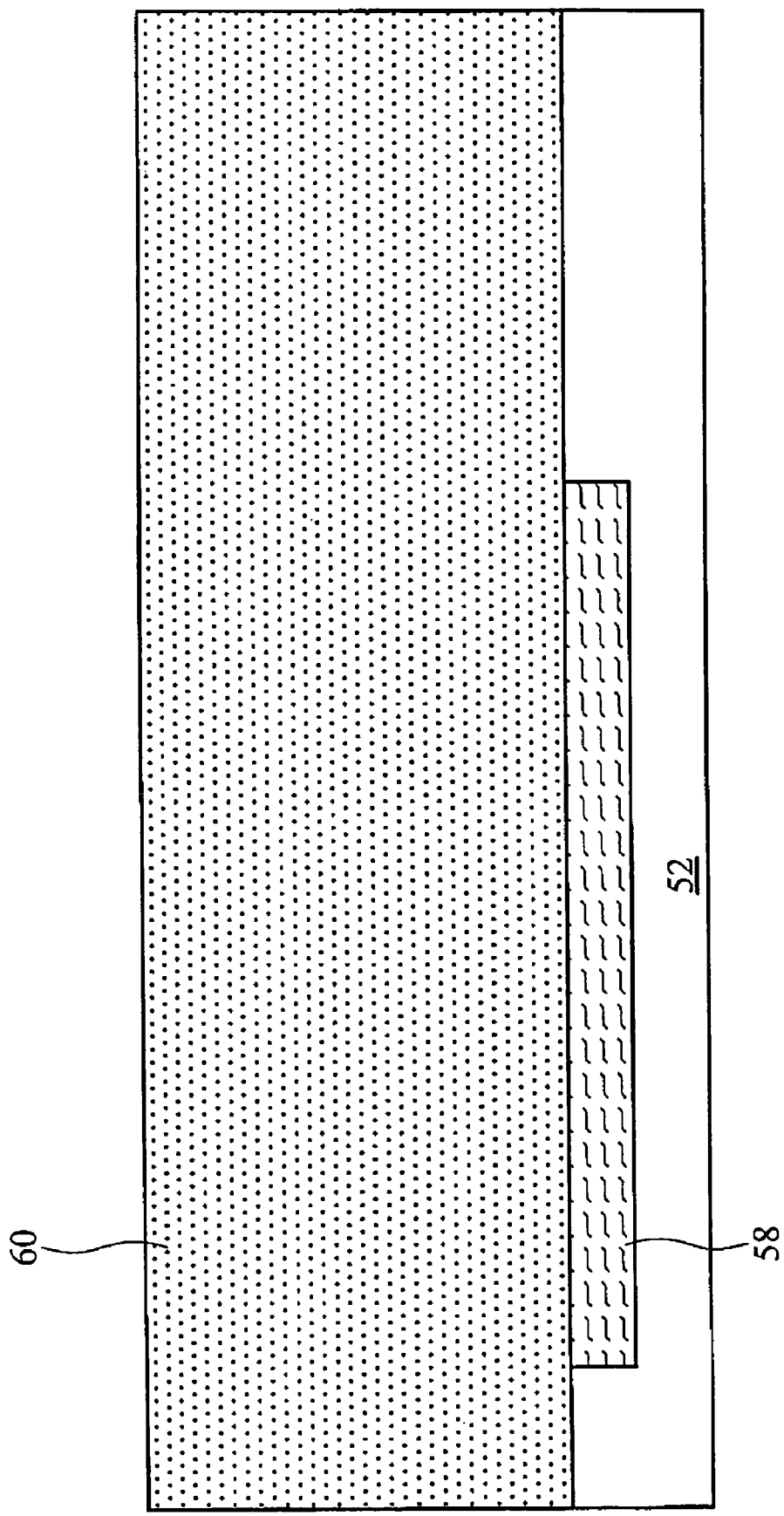
Figure 6:
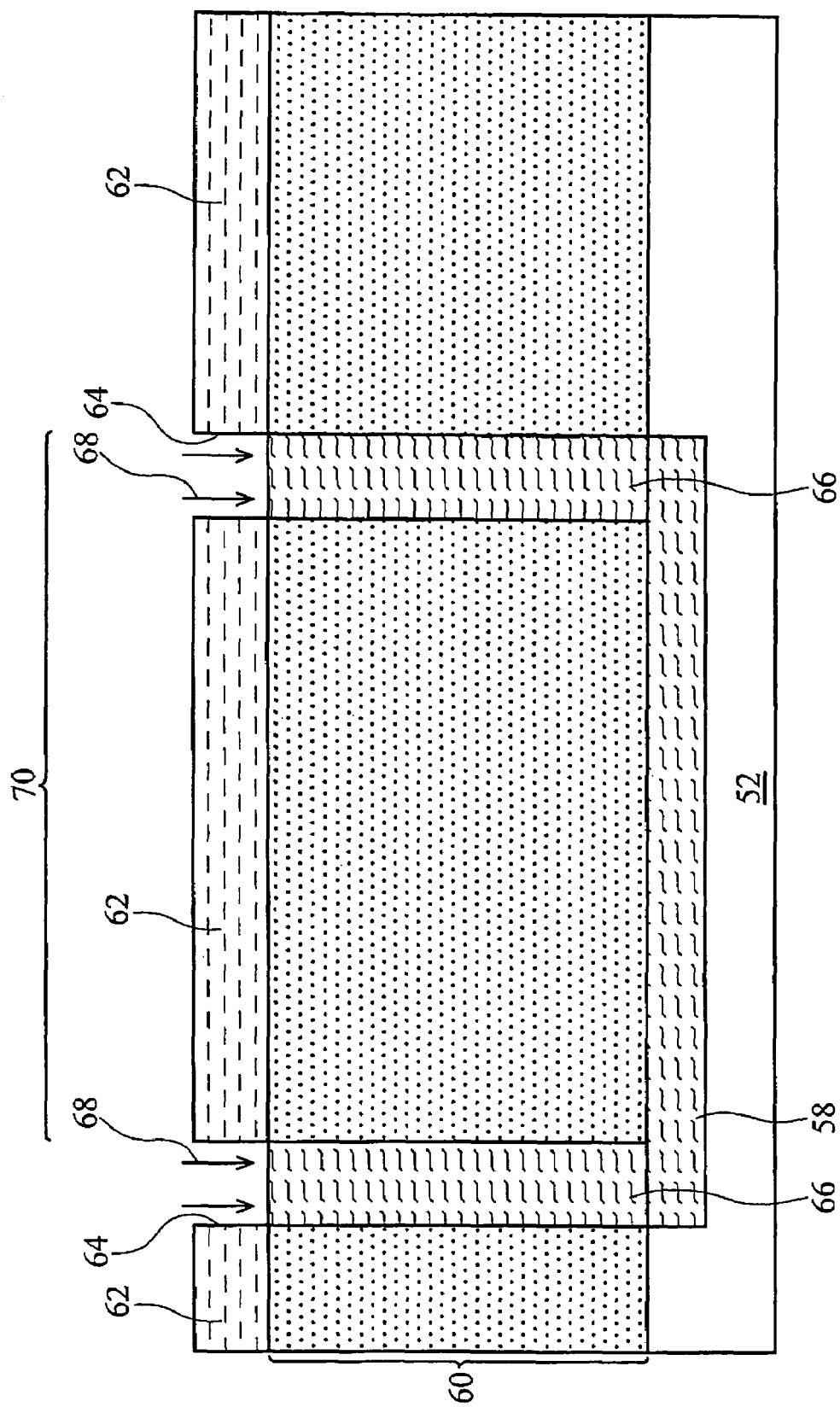

FIG. 5 illustrates a next step in forming the first embodiment, in which a well layer 60 is formed on the substrate 52. The well layer 60 in the first embodiment is an epitaxially grown layer of silicon with p-type doping, for example. In other embodiments, the material and doping type (if any) of the well layer 60 may vary. In FIG. 6, an isolation region patterned mask 62 is formed over the well layer 60 with openings 64 formed therein. In the first embodiment, the isolation region patterned mask 62 is photoresist. In other embodiments, the isolation region patterned mask 62 may be made from any of a variety of suitable masking materials. An isolation region 66 is formed by doping the well layer 60 with a second plurality of ions 68 at the openings 64 formed in the isolation patterned mask 62. The isolation region 66 at least partially bounds and defines a first active region 70 in the well layer 60. In the first embodiment, the isolation region 66 is doped to be n-type, for example. After forming the isolation region 66, the isolation region patterned mask 62 is removed.

Figure 7:
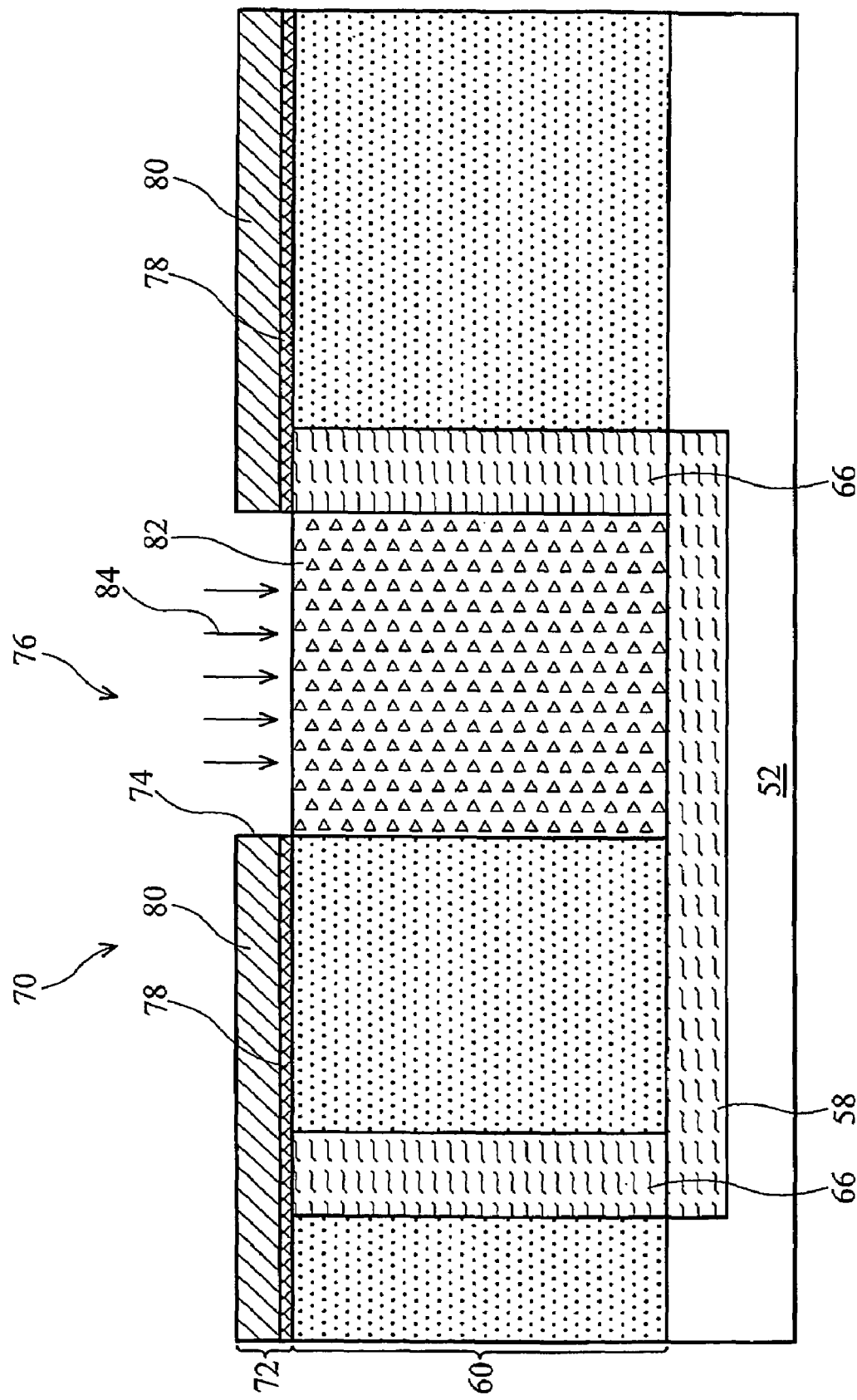

In FIG. 7 a first patterned mask 72 is formed on the well layer 60. The first patterned mask 72 has a first opening 74 formed therein at a first location 76 over the first active region 70 of the well layer 60. The first patterned mask 72 of the first embodiment includes two layers: a pad oxide layer 78 and a silicon nitride layer 80 (e.g., $Si_3N_4$). The first patterned mask 72 may be formed using photolithography and etching processes, for example. A first doped well region 82 is formed in the first active region 70 in the well layer 60 at the first location 76 with a third plurality of ions 84. In the first embodiment, the first doped well 82 is a high voltage n-type well, for example.

Figure 8:
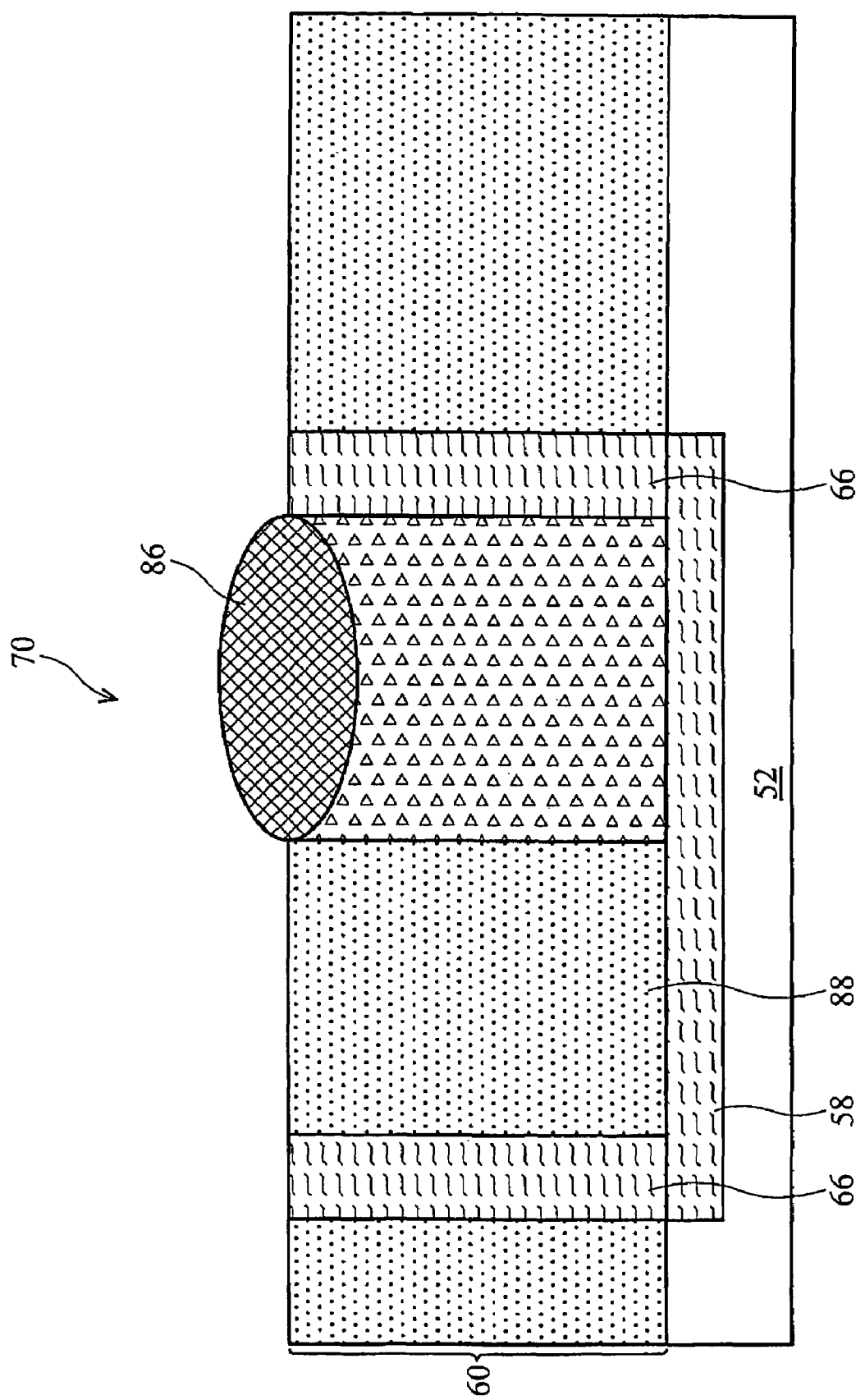

With the first patterned mask 72 still in place, a temporary field oxide 86 is formed on the first doped well region 82 at the first location 76 through the first opening 74. Preferably, the temporary field oxide 86 is thermally grown (e.g., using known thermal growth processes), and in such case the growth of the temporary field oxide 86 consumes material of the well layer 60. After forming the temporary field oxide 86, the first patterned mask 72 is removed. In FIG. 8, the temporary field oxide 86 is shown after the removal of the first patterned mask 72. In the first embodiment, the temporary field oxide 86 is grown to a maximum thickness of about 6000 angstroms. The temporary field oxide 86 is preferably grown to a maximum thickness of at least about 1000 angstroms, for example. The third plurality of ions 84 for the first doped well region 82 may be driven in further with a drive in process, which may be performed sometime after the implanting of the third plurality of ions 84 (e.g., before forming the temporary field oxide 86, after forming the temporary field oxide 86, while driving in ions in another region, etc.).

Figure 9:
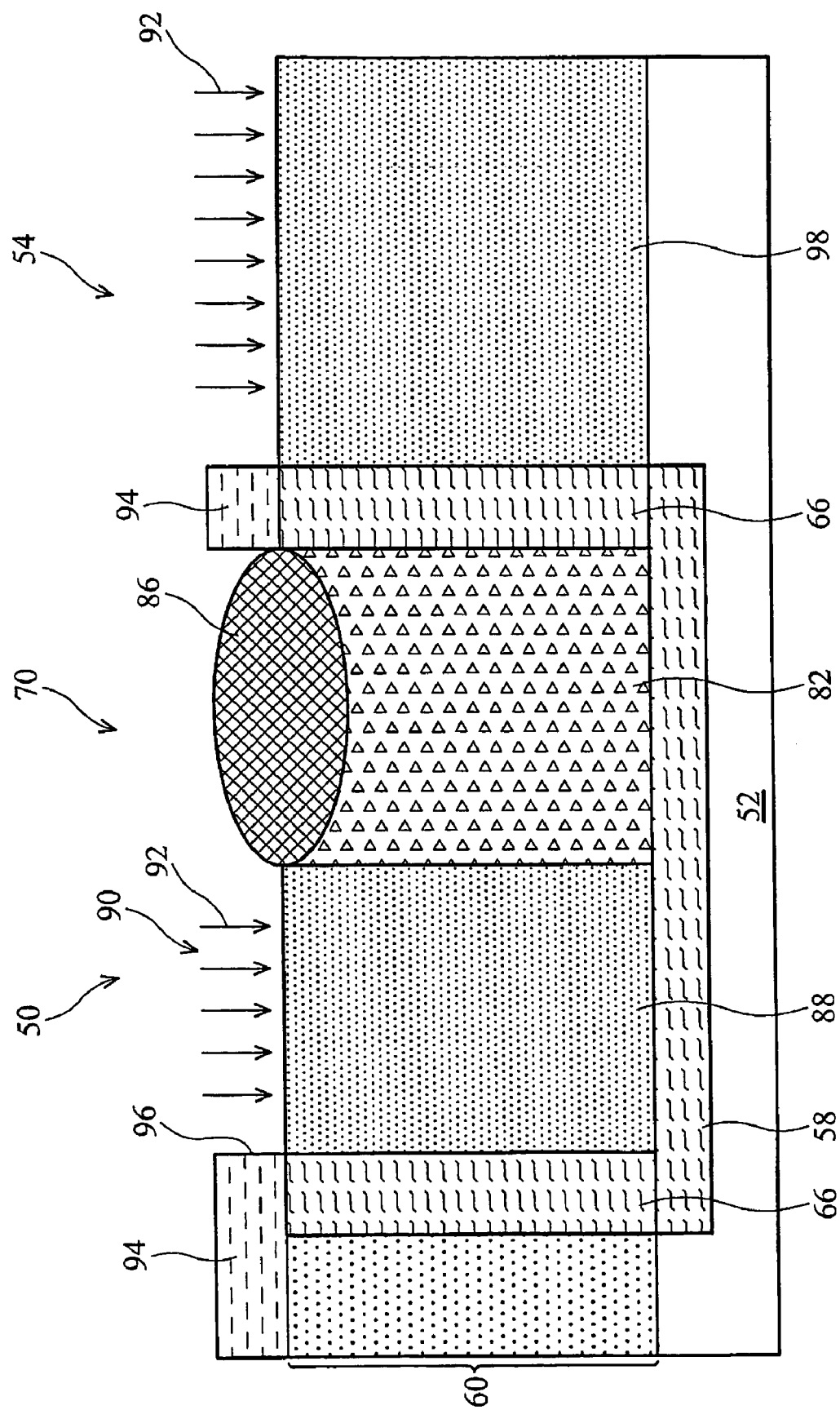

FIG. 9 illustrates a next step in forming the first embodiment, in which a second doped well region 88 is formed in the first active region 70 at a second location 90 with a fourth plurality of ions 92. A second patterned mask 94 has been formed prior to implanting the fourth plurality of ions 92 and the second patterned mask 94 has an opening 96 at the second location 90. The second patterned mask 94 may be any suitable masking material, e.g., photoresist. Also, while forming the second doped well region 88 for the high voltage transistor 50, the same implanting may be used for forming a first low voltage doped region 98 in the well layer 60. Hence, the high voltage transistor 50 and the low voltage transistor 54 are preferably formed in parallel while sharing some of the processing steps. In the first embodiment, the second doped well region 88 is a high voltage p-type well, for example. The fourth plurality of ions 92 for the second doped well region 88 may be driven in further with a drive in process, which may be performed sometime after the implanting of the fourth plurality of ions 92 (e.g., before forming other low voltage doped well regions).

Figure 10:
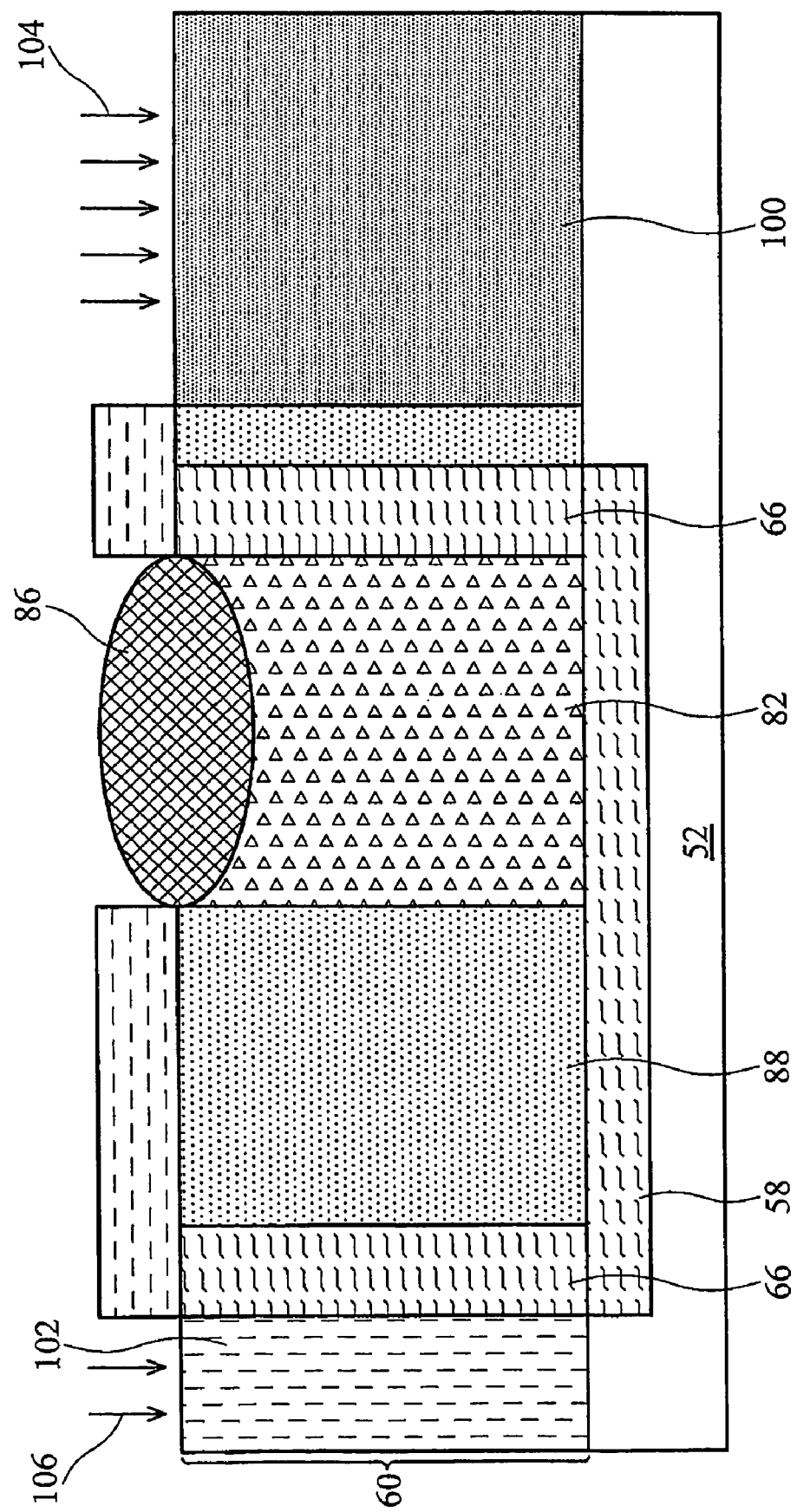

In FIG. 10 the second patterned mask 94 has been removed and low voltage regions 100, 102 are further developed. In the first embodiment, a second low voltage doped well region 100 is formed with a fifth plurality of ions 104, which is a low voltage p-type well, for example. Also in the first embodiment, a third low voltage doped well region 102 is formed with a sixth plurality of ions 106, which is a low voltage n-type well, for example. The masks for these steps illustrated in FIG. 10 are not shown for purposes of simplifying the drawings.

Figure 11:
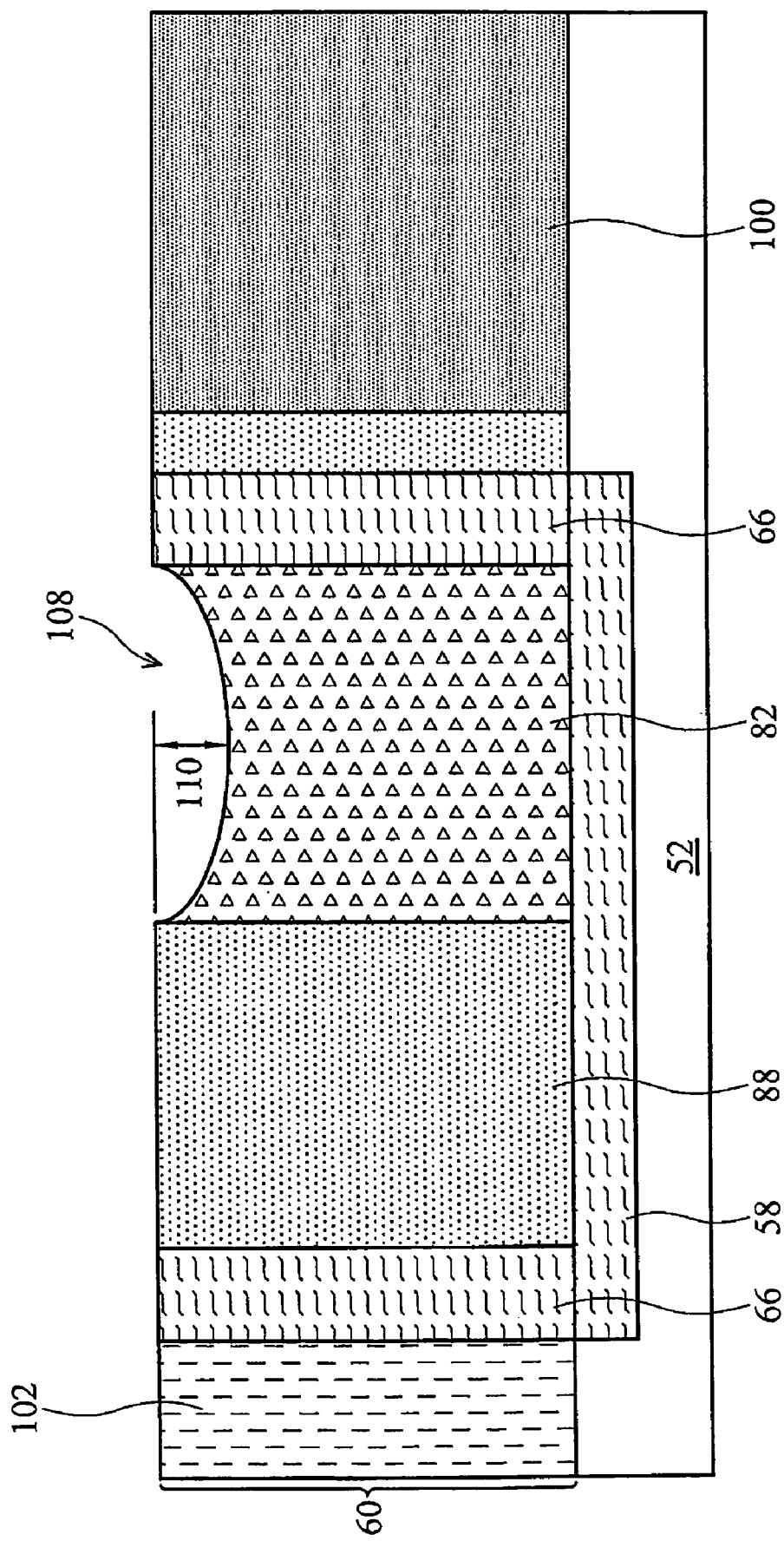

In FIG. 11, the temporary field oxide 86 is removed to form a recess 108 in the first doped well region 82. The recess 108 preferably has a depth 110 of at least about 500 angstroms in a preferred embodiment. In other embodiments, however, the depth 110 of the recess 108 may be about 1000 angstroms or greater, for example. In the first embodiment, for example, the depth 110 of the recess 108 is about 3000 angstroms (after removing the 6000 angstroms thick field oxide 86). The temporary field oxide 86 may be removed using any suitable etching technique. In the first embodiment, the temporary field oxide 86 is removed using a wet etch that is selective against etching silicon, for example.

Figure 12:
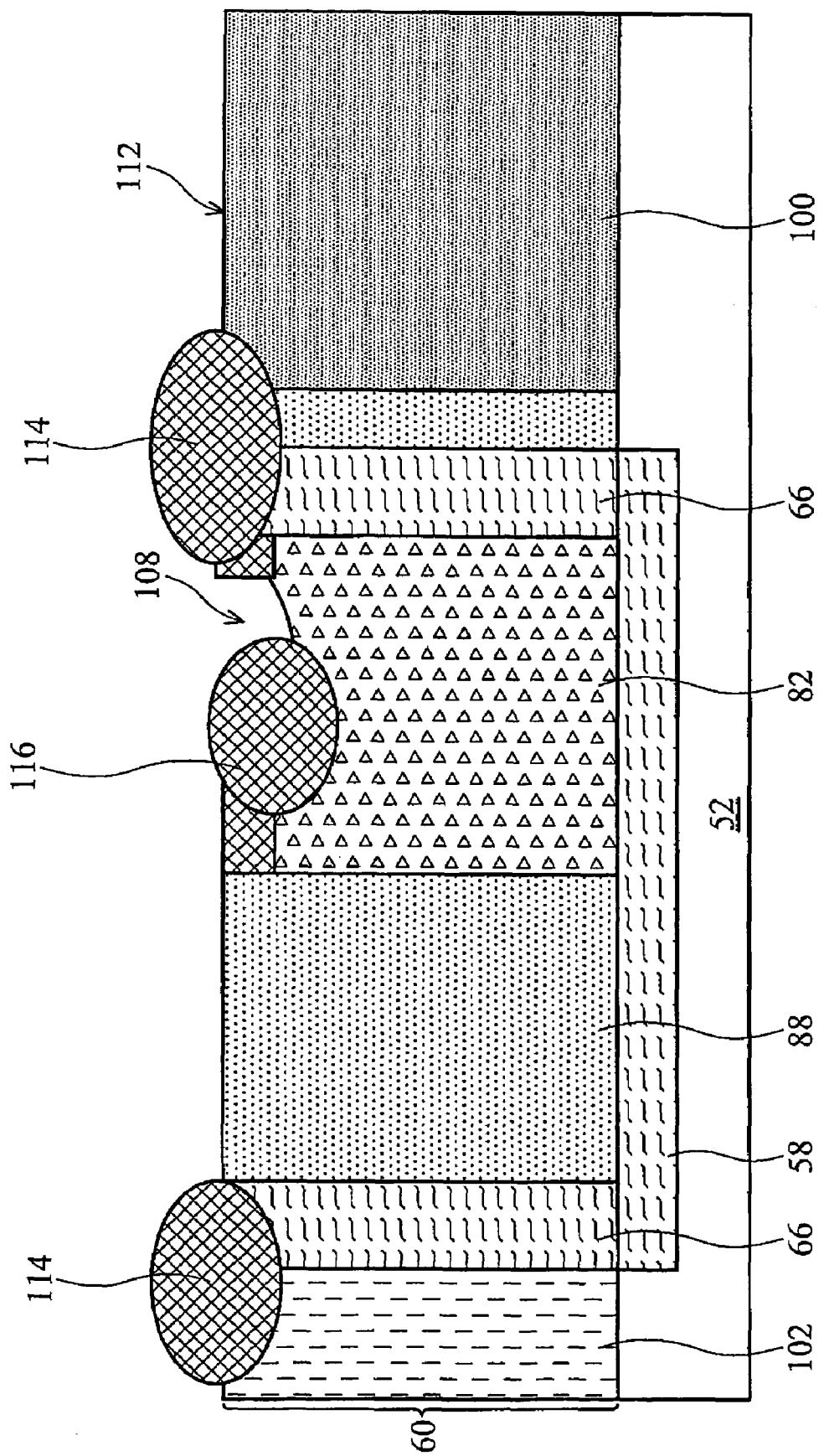

In FIG. 12, permanent field oxide is formed (e.g., grown and/or deposited), although the patterned mask is not shown for purposes of simplifying the figure. Part of the field oxide 114 is formed on the upper surface 112 of the well layer 60 over the isolation regions 66. Another part of the field oxide 116 is formed in the recess 108. The first field oxide 114 and the second field oxide 116 may be formed at the same time using the same material and/or process(es). But alternatively, the first and second field oxides 114, 116 may be formed in different steps using different processes and/or different materials. In the first embodiment, all of the field oxide 114, 116 shown in FIG. 12 is formed using a same thermal growth process. Note that the shapes of the field oxide 114, 116 shown in FIG. 12 are merely schematic, as the actual shape of the field oxide 114, 116 will likely vary and will depend upon the process used to form the field oxide 114, 116. Most notable is that at least part of the second field oxide 116 formed in the recess 108 is lower than the first field oxide 114 formed on the upper surface 112 of the well layer 60. As discussed further below, this structure obtained by forming the second field oxide 116 within the recess 108 provides several advantages and benefits.

Figure 13:
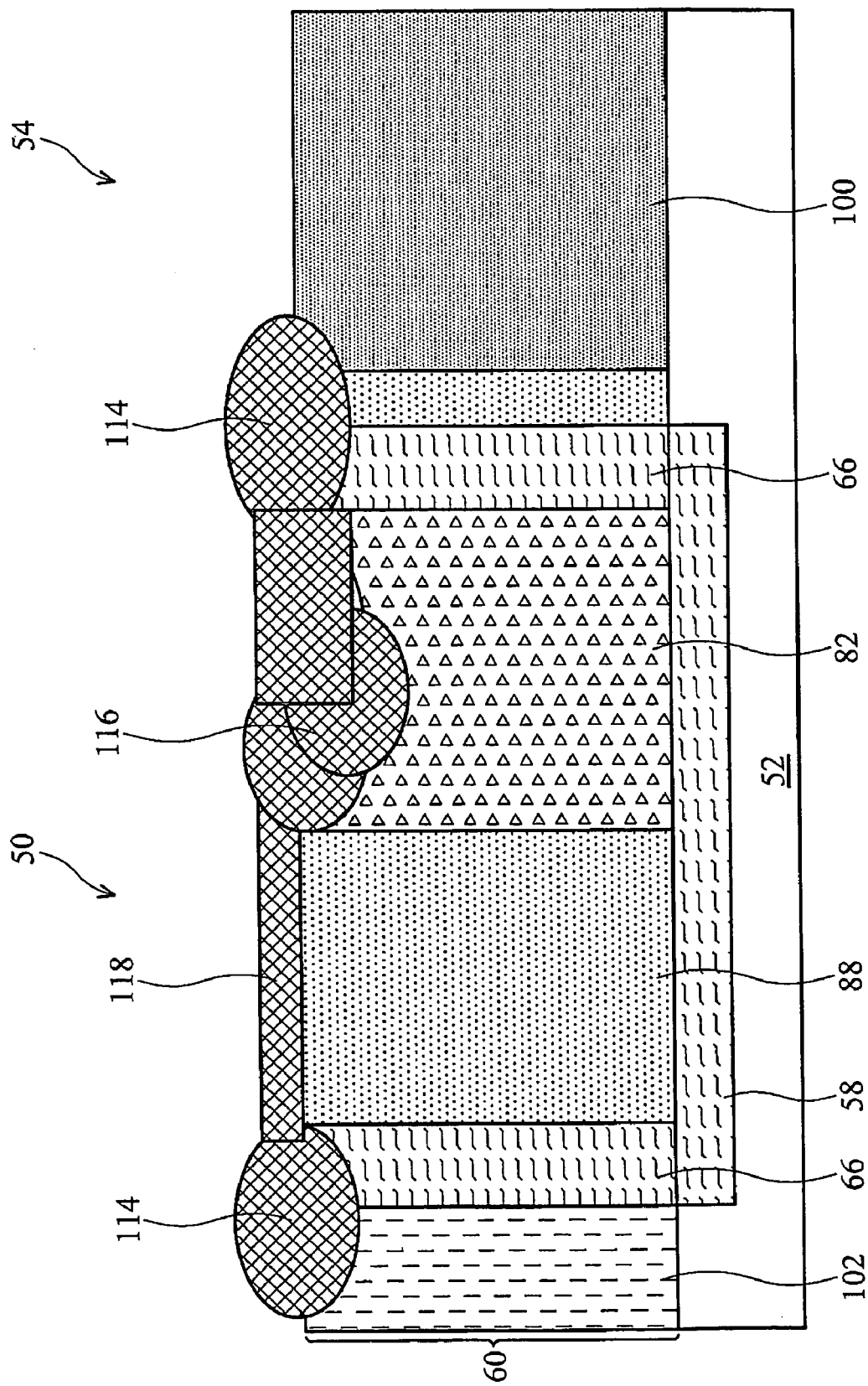
Figure 14:
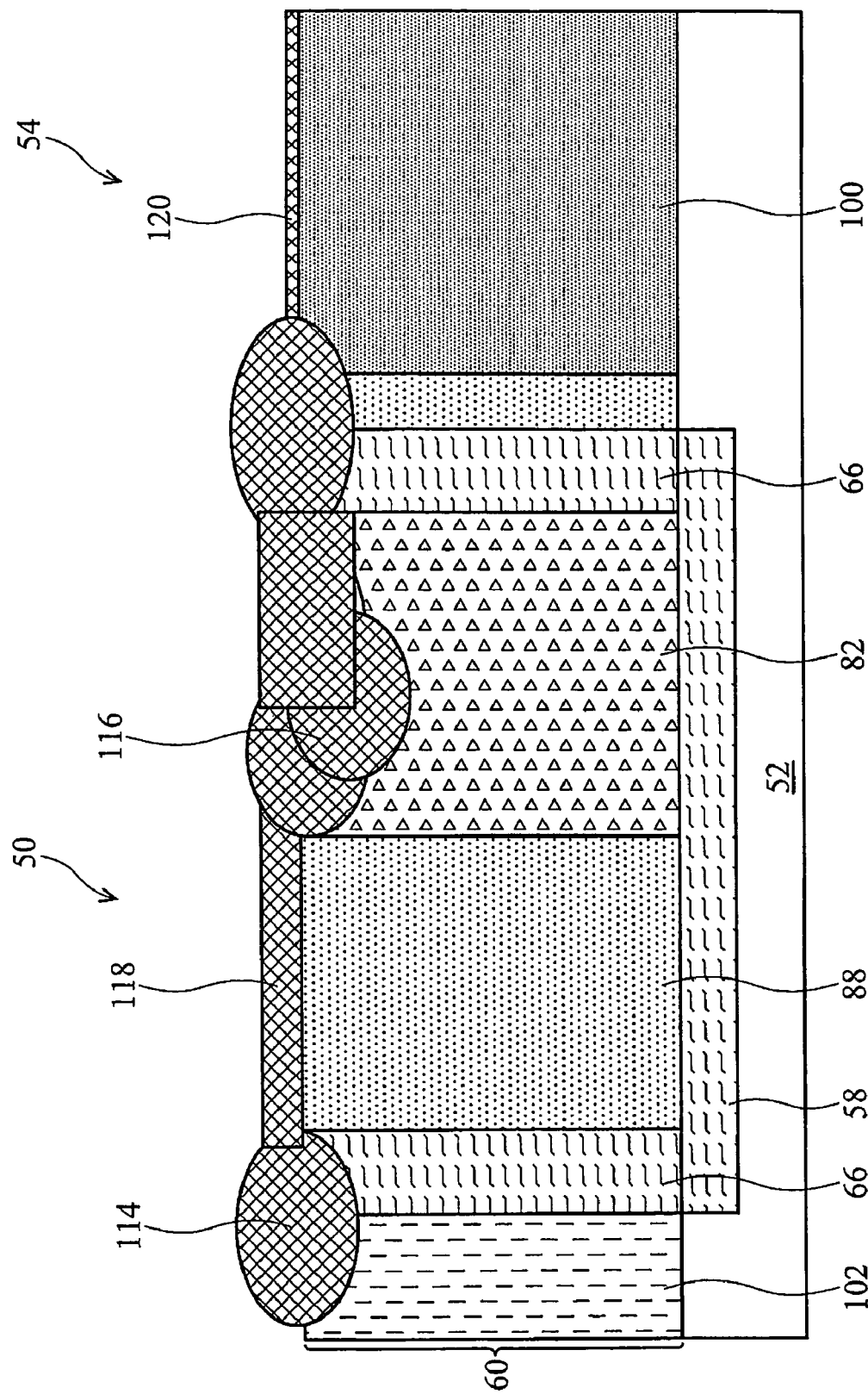

FIG. 13 illustrates a next step in forming the first embodiment, in which oxide material for a gate dielectric 118 in the high voltage transistor 50 is formed. The high voltage gate oxide 118 of the first embodiment is deposited, but in other embodiments, the gate dielectric material 118 may be formed using other processes (e.g., grown and/or deposited). Next, a high voltage $V_t$ implant may be performed to further prepare the gate dielectric material 118 for use. In FIG. 13, the patterned mask used in removing the gate dielectric material from the low voltage portions 54 is not shown for purposes of simplifying the figure.

Figure 15:
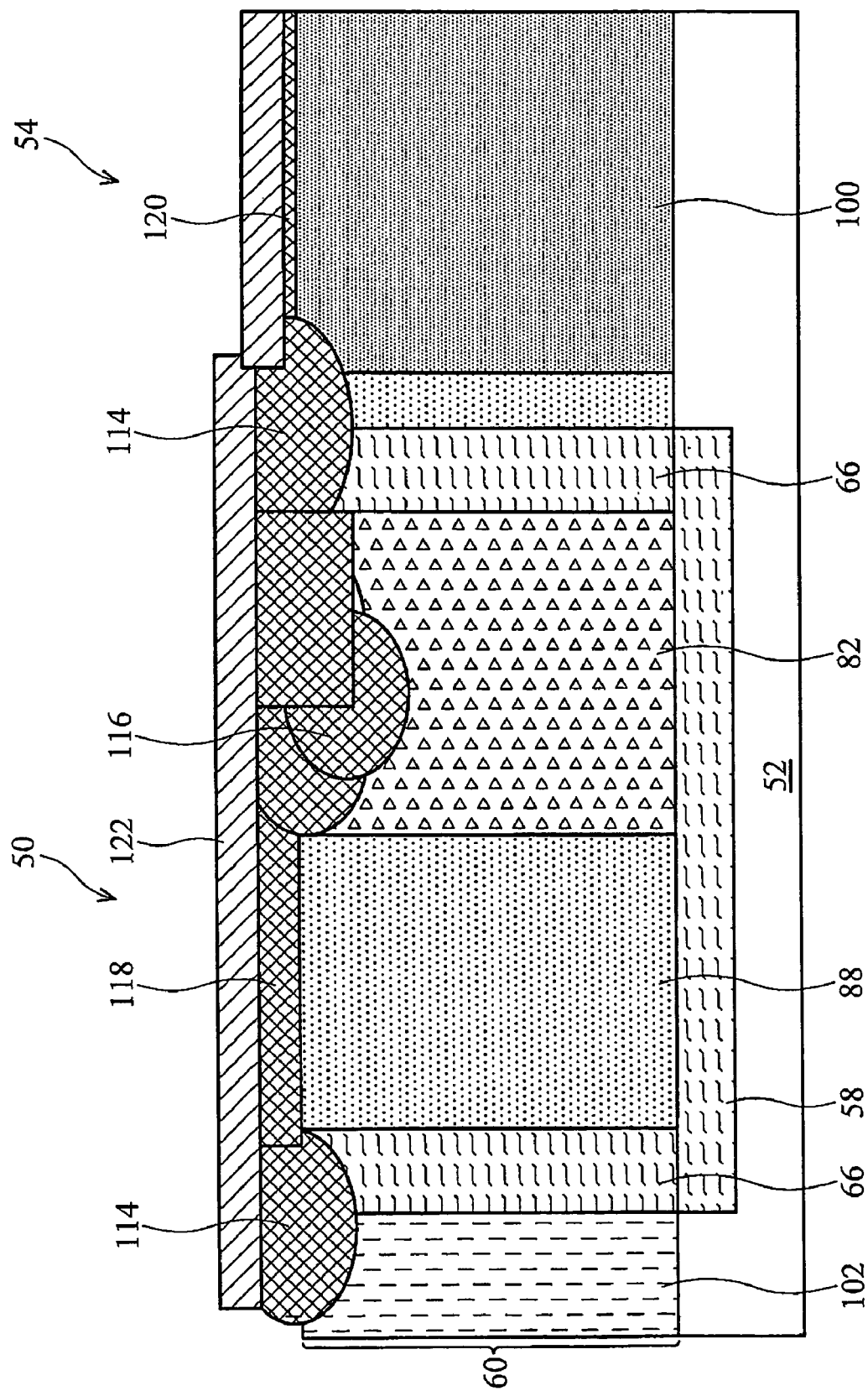
Figure 16:
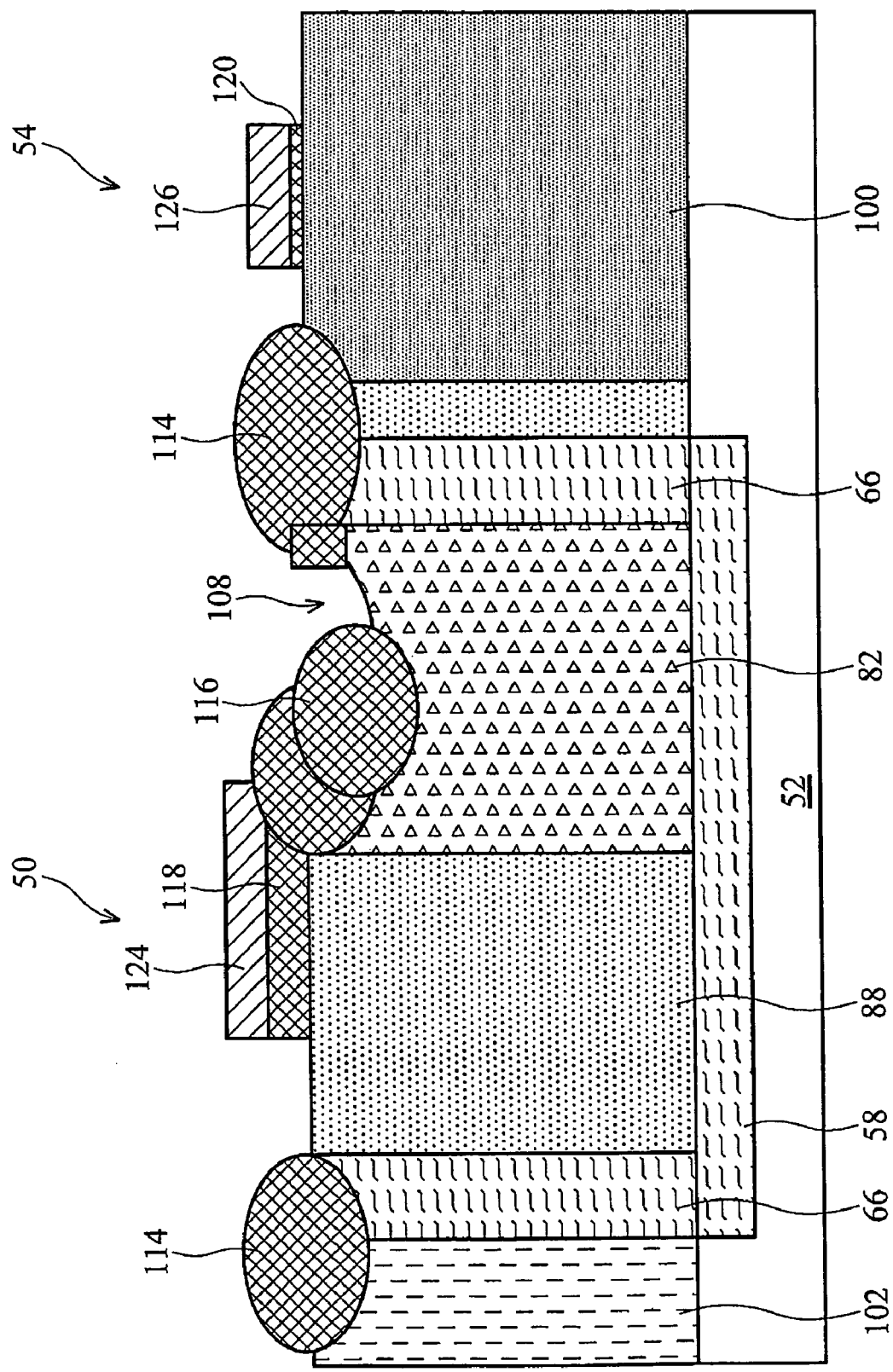

In FIG. 16 of the first embodiment, a low voltage gate dielectric material 120 is formed (e.g., grown and/or deposited) and a low voltage $V_t$ implant is performed. Again, the patterned mask used (if any) to form the low voltage gate dielectric 120 is not shown for purposes of simplifying the figures. In FIG. 15, gate electrode material 122 is deposited over the gate dielectric materials 118, 120. In the first embodiment, the gate electrode material 122 is polysilicon, for example. In a preferred embodiment shown in FIG. 16, the same material is used for the gate electrode 124 of the high voltage transistor 50 and the gate electrode 126 of the low voltage transistor 54.

In FIG. 15, an etch has been performed to form the gate electrodes 124, 126 for the high voltage and low voltage transistors 50, 54. The patterned mask used in forming the gate electrodes 124, 126 is not shown in FIG. 16. In the first embodiment, the etching to form the gate electrodes 124, 126 is a dry etch process; however, other etch processes may be used in other embodiments (e.g., wet etching, reactive-ion etching). Note that the locations for the sources and drains for the transistors 50, 54 are exposed in FIG. 16 after the etching process(es). Also, note that the shapes shown in FIG. 16 for the resulting field oxides 114, 116 are merely schematic representations, as the actual shapes will likely vary from the simplified shapes shown.

Figure 17:
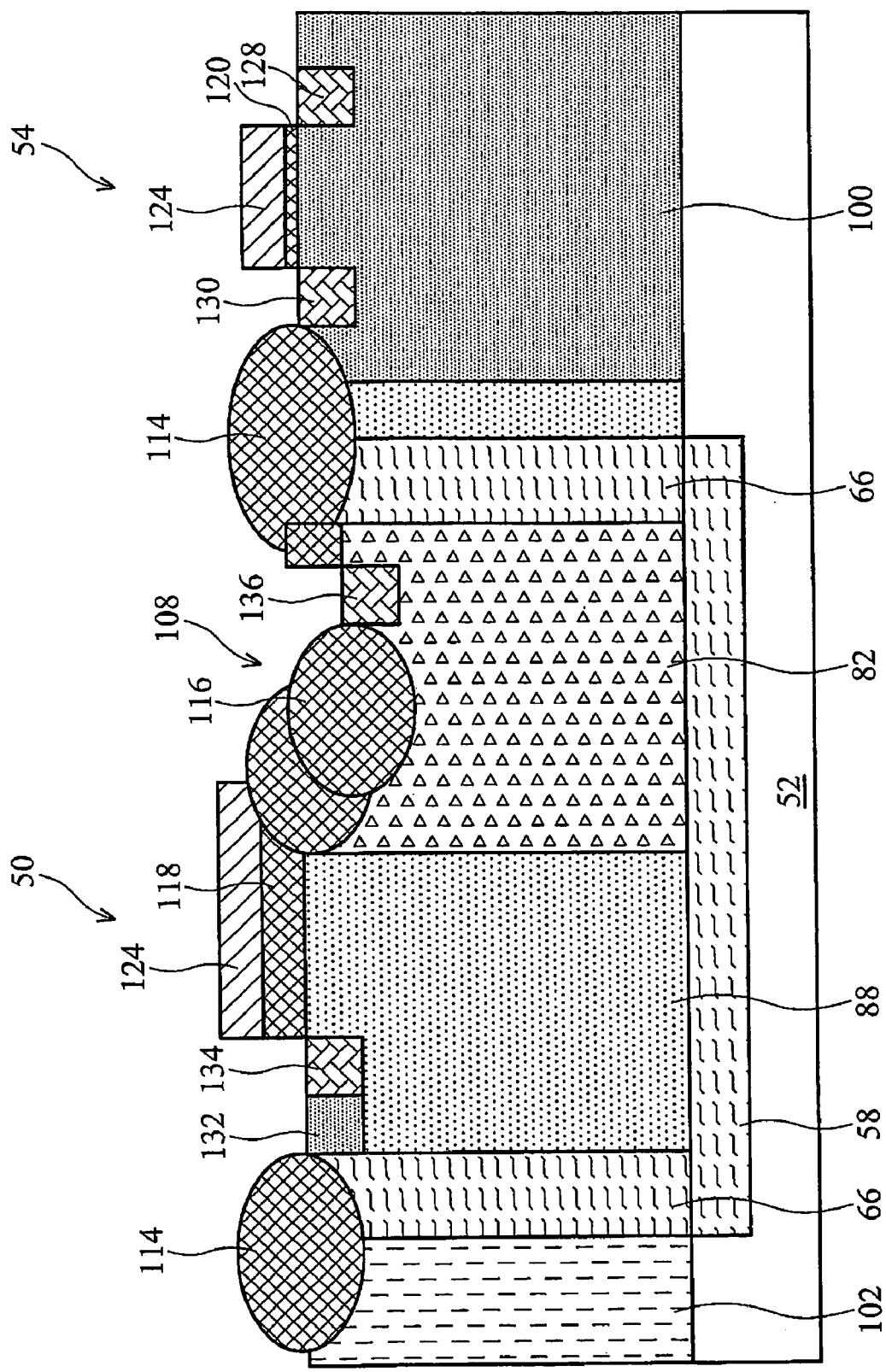

In FIG. 17, N+ and P+ implants have been formed for the sources and drains of transistors 50, 54. An N+ source doped region 128 and an N+ drain doped region 130 are formed for the low voltage transistor 54 of the first embodiment. Also, a P+ source doped region 132 and an N+ source doped region 134 are formed for the high voltage transistor 50 of the first embodiment. A drain doped region 136 (N+ type in the first embodiment) is formed in the recess 108 and in the first doped well region 82 adjacent to the second field oxide 116. Thus, the second field oxide 116 is located between the gate electrode 124 and the drain doped region 136.

Note that FIG. 17 is a simplified schematic of the transistor structure 50 of the first embodiment. An embodiment of the present invention may further include other features, such as spacer(s) (not shown) around the gate electrode 124, for example.

Although the first embodiment is an NMOS transistor, another embodiment of the present invention may be a PMOS transistor. Hence for a PMOS transistor, the first doped well region 82 would be p-type, the second doped well region 88 would be n-type, and the type of other portions/regions would be reversed as well (i.e., p-type instead of n-type, and n-type instead of p-type). Such variations should be apparent to one of ordinary skill in the art.

If the second field oxide 116 is formed on an n-type first doped well region 82, it is preferred that the n doping concentration is larger in the first doped well region 82 than that of the isolation region 66. And if the second field oxide 116 is formed on a p-type first doped well region 82, it is preferred that the p doping concentration is larger in the first doped well region 82 than that of the isolation region 66. Although field oxide (e.g., formed by a LOCOS process) is shown in the first embodiment, other types of isolation structures (e.g., shallow trench isolation, deposited insulating material, etc.) may be used in other embodiments in place of some or all of the field oxide portions. It is also contemplated that the isolation region 66 in the well layer 60 may be formed by a shallow or deep trench filled with insulating material (not shown), for example.

An embodiment of the present invention may reduce hot carrier issues in a power LDMOS device 50, for example, when a high electron field develops between the drain 136 and gate electrode 124. An embodiment of the present invention displaces the drain doped region 136 farther from the gate electrode 124 and changes the primary flow path of electrons between the source 134 and drain 136, as compared to the prior art structure 20 (see FIG. 1). Also, a transistor structure of an embodiment may release (change) the surface electron field, and thereby decrease the hot carrier issues and increase the on-breakdown voltage level, as compared to the prior art structure 20 (see FIG. 1).

Figure 2:
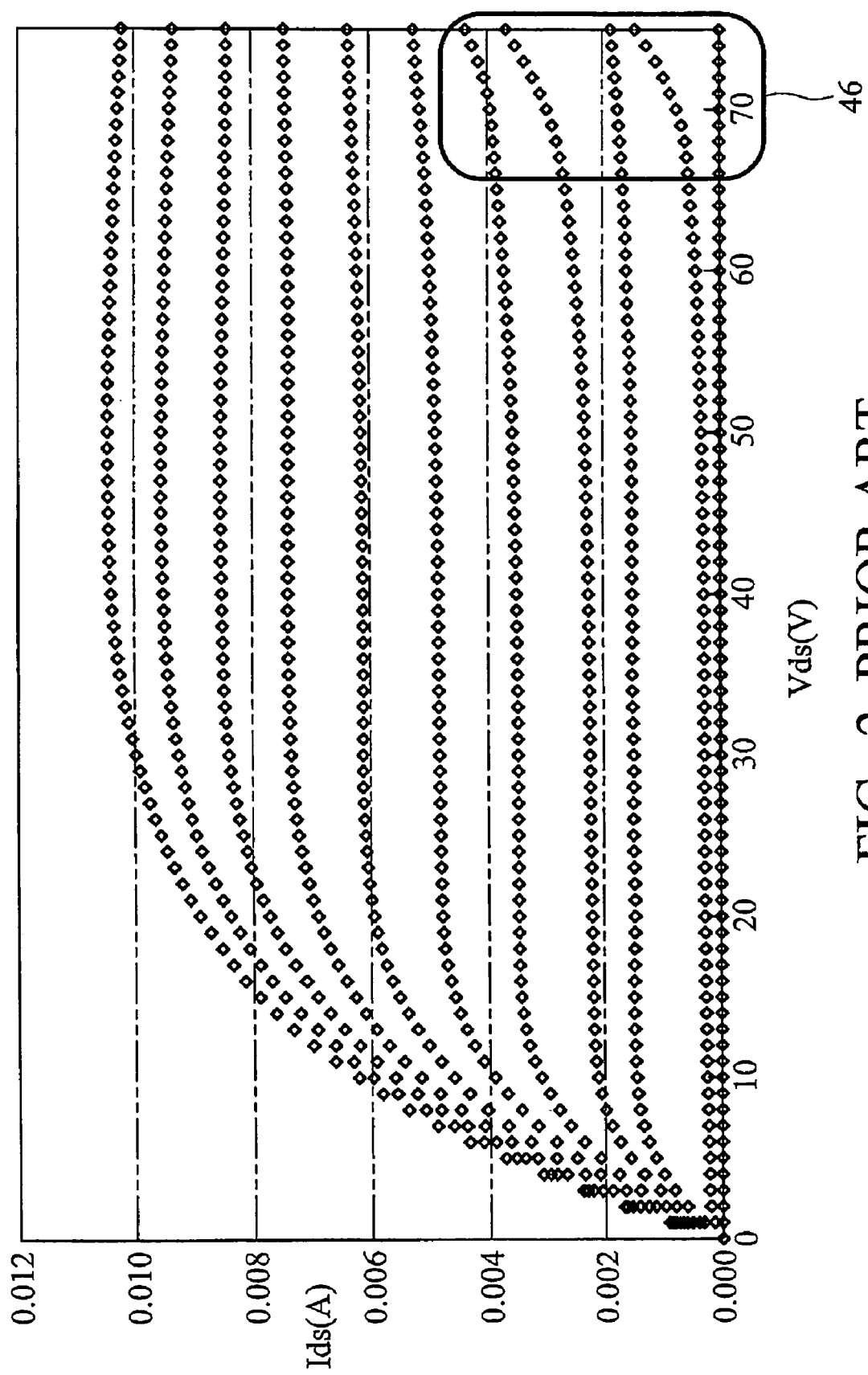
FIG. 2 is an IV operation curve for the transistor of FIG. 1.
Figure 18:
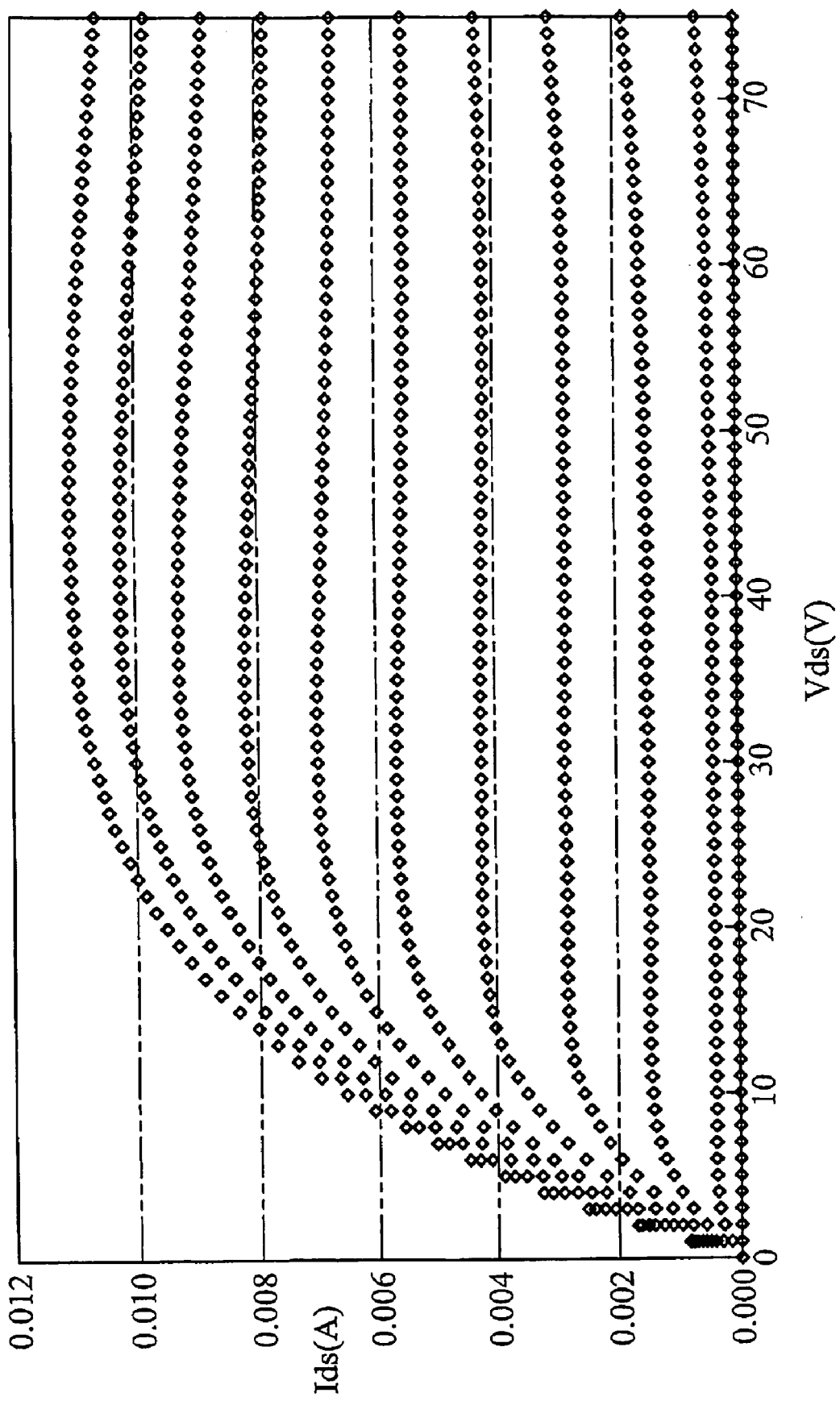
FIG. 18 is an IV operation curve for the transistor of FIG. 17.

Thus, the transistor structure 50 provided by the first embodiment (see FIG. 17) may provide advantages of an improved performance compared to the prior art transistor structure 20 of FIG. 1 by reducing hot carrier effects and increasing the on-breakdown voltage level for an LDMOS power device 50. Furthermore, an embodiment of the present invention may reduce or eliminate hot carriers forming between the drain 136 and the gate electrode 124 when there is a higher electron field between the drain 136 and gate electrode 124. Also, an embodiment of the present invention may provide improved reliability, increased gate oxide integrity (GOI), and a more ideal IV operation curve at high voltage levels. An IV operation curve for the LDMOS device 50 of the first embodiment illustrated in FIG. 17 is shown in FIG. 18, which has a more ideal IV operation curve for higher voltages from drain to source ($V_{ds}$). Note that Region 46 in FIG. 2, where the voltage from drain to source ($V_{ds}$) becomes higher (e.g., above about 60 V), is improved by the first embodiment (i.e., comparing FIG. 2 with FIG. 18). Therefore, an embodiment of the present invention may provide a LDMOS device that has a more ideal IV operation curve at higher voltage levels for $V_{ds}$ (e.g., above about 60 V) to provide more reliable operation of the LDMOS device at such levels.

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or step.

What is claimed is:

1. A method of fabricating a transistor, comprising:
   forming a first doped well region in a first active region of a well layer;
   forming a temporary field oxide on the first doped well region;
   forming a first patterned mask over the first active region of the well layer, the first patterned mask having at least a first opening formed therein over the first active region, wherein the temporary field oxide is formed through the first opening;
   after forming the temporary field oxide, removing the first patterned mask;
   removing the temporary field oxide to form a recess in the first doped well region;
   forming a permanent field oxide, wherein at least part of the permanent field oxide is formed in the recess;
   forming a drain doped region in the recess and in the first doped well region adjacent to the part of the permanent field oxide formed in the recess; and
   forming a gate electrode over the first active region such that at least part of the gate electrode is adjacent to the recess, wherein the part of the permanent field oxide formed in the recess is located between the gate electrode and the drain doped region.

2. The method of claim 1, further comprising:
   forming an insulating region in the well layer to define the first active region.

3. The method of claim 2, wherein the forming an insulating region in the well layer comprises implanting the well layer with ions.

4. The method of claim 1, further comprising:
   forming a second doped well region in the first active region in the well layer adjacent to the first doped well region, wherein at least part of the second doped well region is located under the gate electrode.

5. The method of claim 1, further comprising:
   forming a buried doped layer in a substrate;
   driving in ions of the buried doped layer further into the substrate; and
   forming the well layer on the substrate and over the buried doped layer, wherein the first active region is over the buried doped layer.

6. The method of claim 1, wherein the first patterned mask comprises:
   a pad oxide layer; and
   a silicon nitride layer formed on the pad oxide layer.

7. The method of claim 1, wherein the temporary field oxide has a thickness of about 6000 angstroms.

8. The method of claim 1, wherein the transistor is an LDMOS transistor.

9. The method of claim 1, wherein the recess has a depth of at least about 500 angstroms.

10. The method of claim 1, wherein the temporary field oxide is fully removed by the step of removing the temporary field oxide.

11. The method of claim 1, wherein the step of forming the gate electrode is performed after the step of removing the temporary field oxide.

12. The method of claim 11, wherein the step of forming the gate electrode is performed after the step of forming the permanent field oxide.

13. A method of fabricating a transistor, comprising:
   forming a first doped well region in a first active region of a well layer with a first plurality of ions;
   forming a temporary field oxide on the first doped well region;
   removing the temporary field oxide to form a recess in the first doped well region;
   forming a permanent field oxide, wherein at least part of the permanent field oxide is formed in the recess;

forming a drain doped region in the recess and in the first doped well region adjacent to the part of the permanent field oxide formed in the recess; and after the step of removing the temporary field oxide, forming a gate electrode over the first active region such that at least part of the gate electrode is adjacent to the recess, wherein the part of the permanent field oxide formed in the recess is located between the gate electrode and the drain doped region.

14. The method of claim 13, wherein the temporary field oxide is fully removed by the step of removing the temporary field oxide.

15. The method of claim 13, wherein the step of forming the gate electrode is performed after the step of forming the permanent field oxide.

16. A method of fabricating a transistor, comprising:

forming a buried doped layer in a substrate with a first plurality of ions;

driving in ions of the buried doped layer further into the substrate;

forming a well layer on the substrate and over the buried doped layer;

forming an insulating region in the well layer with a second plurality of ions to at least partially bound and define a first active region in the well layer and over the buried doped layer;

forming a first patterned mask layer over the first active region of the well layer, the first patterned mask layer having a first opening formed therein over the first active region at a first location;

forming a first doped well region in the first active region in the well layer at the first location with a third plurality of ions;

forming a temporary field oxide at the first location over the first doped well region;

removing the first patterned mask layer;

forming a second patterned mask layer over the well layer, the second patterned mask layer having a second opening formed therein over the first active region at a second location;

forming a second doped well region in the first active region in the well layer at the second location with a fourth plurality of ions, the second location being adjacent to the first location;

removing the second patterned mask layer;

removing the temporary field oxide to form a recess in the first doped well region at the first location, the recess having a depth of at least about 500 angstroms;

forming a permanent field oxide, wherein at least part of the permanent field oxide is formed in the recess;

forming a drain doped region in the recess and in the first doped well region adjacent to the part of the permanent field oxide formed in the recess; and forming a gate electrode over the second doped well region such that at least part of the gate electrode is adjacent to the recess, wherein the part of the permanent field oxide formed in the recess is located between the gate electrode and the drain doped region.

17. The method of claim 16, wherein the buried doped layer is N-type, the well layer is P-type, the insulating region is N-type, the first doped well region is N-type, and the second doped well region is P-type.

* * * * *